(12) United States Patent
Song

(10) Patent No.: US 6,682,957 B2
(45) Date of Patent: Jan. 27, 2004

(54) SEMICONDUCTOR SUBSTRATE AND LAND GRID ARRAY SEMICONDUCTOR PACKAGE USING SAME AND FABRICATION METHODS THEREOF

(75) Inventor: Chi-Jung Song, Daejon (KR)

(73) Assignee: Hyundai Electromics Industries Co., Ltd., Ichon (KR)

(*) Notice: Subject to any disclaimer, the term of this patent is extended or adjusted under 35 U.S.C. 154(b) by 0 days.

(21) Appl. No.: 10/157,116

(22) Filed: May 30, 2002

(65) Prior Publication Data

US 2002/0151112 A1 Oct. 17, 2002

Related U.S. Application Data

(62) Division of application No. 09/095,570, filed on Jun. 11, 1998, now Pat. No. 6,441,498.

(30) Foreign Application Priority Data

Dec. 2, 1997 (KR) ............................................ 98-65209

(51) Int. Cl.[7] .............................................. H01L 21/44
(52) U.S. Cl. ....................... 438/123; 438/124; 438/126; 257/778
(58) Field of Search ................................ 438/121, 123, 438/124, 126; 257/778, 693

(56) References Cited

U.S. PATENT DOCUMENTS

| 5,241,133 | A | | 8/1993 | Mullen, III et al. ........ 174/52.4 |
| 5,355,283 | A | | 10/1994 | Marrs et al. ................. 361/760 |
| 5,552,635 | A | * | 9/1996 | Kim et al. ................... 257/706 |
| 5,835,988 | A | * | 11/1998 | Ishii ............................ 257/684 |
| 6,020,220 | A | * | 2/2000 | Gilleo et al. ................. 438/119 |
| 6,030,858 | A | * | 2/2000 | Cha et al. .................... 438/123 |
| 6,177,725 | B1 | * | 1/2001 | Yamada et al. .............. 257/704 |
| 6,242,798 | B1 | | 6/2001 | Cha et al. .................... 257/673 |

FOREIGN PATENT DOCUMENTS

| JP | 58-109254 | 7/1983 |
| JP | 08-167691 | 6/1996 |
| JP | 09-148477 | 6/1997 |
| WO | WO96/42107 | 12/1996 |

* cited by examiner

*Primary Examiner*—Carl Whitehead, Jr.
*Assistant Examiner*—David S Blum
(74) *Attorney, Agent, or Firm*—Fleshner & Kim, LLP

(57) ABSTRACT

A land grid array (LGA) type semiconductor chip package includes an insulation body having a plurality of first conductive interconnections embedded therein. A cavity is formed in an upper portion of the insulation body. A plurality of first conductive interconnection patterns is formed outside the cavity and on marginal upper surfaces of the insulation body, and a plurality of second conductive interconnection patterns is formed on marginal lower surfaces of the insulation body. A plurality of third conductive interconnection patterns electrically connects the first and second conductive interconnection patterns, and a plurality of conductive bond pads is formed on a bottom of the cavity. A semiconductor chip is attached on the respective bond pads by a first adhesive member and a heat discharge member is attached by a second adhesive member on an upper surface of the semiconductor chip. An epoxy molding compound fills the cavity. The semiconductor package of the preferred embodiment enhances heat discharge efficiency and improves solder joint reliability.

19 Claims, 5 Drawing Sheets

(A)

(B)

(C)

SEMICONDUCTOR SUBSTRATE AND LAND GRID ARRAY SEMICONDUCTOR PACKAGE USING SAME AND FABRICATION METHODS THEREOF

This application is a Divisional of application Ser. No. 09/095,570 filed Jun. 11, 1998 now U.S. Pat. No. 6,441,498.

BACKGROUND OF THE INVENTION

1. Field of the Invention

The present invention relates to a semiconductor chip package, and more particularly to an improved semiconductor substrate and land grid array (hereinafter, referred to as "LGA") type semiconductor chip package using the same and respective fabrication methods thereof.

2. Background of the Related Art

Recently, a quad flat package (hereinafter, referred to as "QFP") is widely employed as a multi-pin package and allows the outer leads to become narrower in width and the pitches between respective leads to become smaller. However, such a structure causes the leads to easily bend. Further, when such a multi-pin package is mounted on a printed circuit board, an appropriate alignment and an adjustment of a soldering amount between the package and the printed circuit board are difficult. In order to overcome the disadvantages of QFP while satisfying the prevailing multi-pin package trend, a ball grid array (hereinafter, referred to as "BGA") type semiconductor package has been developed. The BGA type semiconductor package employs solder balls which serve to substitute for outer leads, and overcomes the disadvantages of QFP.

As shown in FIG. 1, the BGA package includes a substrate 1 embedded by a plurality of patterned conductive interconnections (not shown). A semiconductor chip 2 is attached by an adhesive 3 onto the substrate 1. The semiconductor chip 2 and the plurality of interconnections (not shown) embedded in the substrate 1 are electrically connected by corresponding ones of a plurality of conductive wires 4. Also, the semiconductor chip 2 and the wires 4 are encapsulated by a molding compound 5. A plurality of solder balls 6 disposed on the bottom surface of the substrate 1 are respectively connected to a corresponding one of the interconnections (not shown) embedded in the substrate 1. Here, the respective interconnection (not shown) in the substrate 1 respectively serves as a channel which electrically links between the upper and lower surfaces of the substrate 1.

However, the semiconductor chip of FIG. 1 is completely sealed by the molding compound, and external heat dissipation from the semiconductor chip is difficult. Further, because the solder balls serving as input/output terminals for electrical signals are formed only on the bottom surface of the substrate, a multi-layer semiconductor package module is difficult to manufacture.

SUMMARY OF THE INVENTION

It is an object of the invention to overcome the problems of the related art.

Another object of the invention is to improve heat dissipation in chip packages.

A further object of the invention is to provide a laminated structure for a multi-layer semiconductor package module.

A further object of the invention is to improve solder joint reliability.

Accordingly, it is another object of the present invention to provide a semiconductor substrate for a semiconductor package and a land grid array (LGA) type semiconductor chip package using the same and respective fabrication methods thereof.

To achieve the above-described objects in a whole or in parts, the semiconductor substrate for a semiconductor package according to the present invention includes an insulation body having a plurality of first conductive interconnections embedded therein, a cavity formed in an upper central portion of the insulation body, a plurality of first conductive interconnection patterns formed outside the cavity and on each of the respective marginal upper surfaces of the insulation body, a plurality of second conductive interconnection patterns formed on each of the respective marginal lower surfaces of the insulation body, a plurality of third conductive interconnection patterns for electrically connecting the first and second conductive interconnection patterns, and a plurality of conductive bond pads formed on a bottom of the cavity.

Further, to achieve the above-described objects in a whole or in parts, the LGA (Land Grid Array) type semiconductor chip package includes an insulation body having a plurality of first conductive interconnections embedded therein, a cavity formed in an upper central portion of the insulation body, a plurality of first conductive interconnection patterns formed outside the cavity and on each of the respective marginal upper surfaces of the insulation body, a plurality of second conductive interconnection patterns formed on each of the respective marginal lower surfaces of the insulation body, a plurality of third conductive interconnection patterns for electrically connecting the first and second conductive interconnection patterns, a plurality of conductive bond pads formed on a bottom of the cavity, a semiconductor chip formed by a first adhesive member on the respective bond pads, a heat discharge member attached by a second adhesive member on an upper surface of the semiconductor chip, and an epoxy molding compound filled in the cavity.

Still further, to achieve the above-described objects in a whole or in parts, the substrate fabrication method for a semiconductor chip package according to the present invention includes the steps of forming an insulation body having a plurality of first conductive interconnections embedded therein, forming a plurality of cavities in upper central portions of the insulation body, forming a plurality of first conductive interconnection patterns outside the cavity and on each of the respective marginal upper surfaces of the insulation body, forming a plurality of second conductive interconnection patterns on each of the respective marginal lower surfaces of the insulation body, forming a plurality of through holes formed vertically through the first and second conductive interconnection patterns and the insulation body provided between the first and second conductive interconnection patterns, filling of the plurality of through holes with conductive material, forming a rectangular opening in the insulation body by removing respective outside portions of the conductive material filled in each of the through holes, and forming a plurality of conductive bond pads on each bottom of the cavities.

Also, to achieve the above-described objects in a whole or in parts, the substrate fabrication method for a semiconductor chip package according to the present invention includes the steps of forming an insulation body having a plurality of first conductive interconnections embedded therein, forming a plurality of cavities in upper central portions of the insulation body, forming a plurality of first conductive interconnection patterns outside the cavity and on each of the respective marginal upper surfaces of the insulation body, forming a plurality of second conductive interconnection patterns on each of the respective marginal lower surfaces of the insulation body, forming a plurality of through holes formed vertically through the first and second conductive interconnection patterns and the insulation body provided between the first and second conductive interconnection patterns, filling of the plurality of through holes with conductive material, forming a rectangular opening in the insulation body by removing respective outside portions of the conductive material filled in each of the through holes, forming a plurality of conductive bond pads on each bottom of the cavities, forming a semiconductor chip by a first adhesive member on the bond pads, forming a heat discharge member by a second adhesive member on an upper surface of the semiconductor chip, and filling an epoxy molding compound in the cavity.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
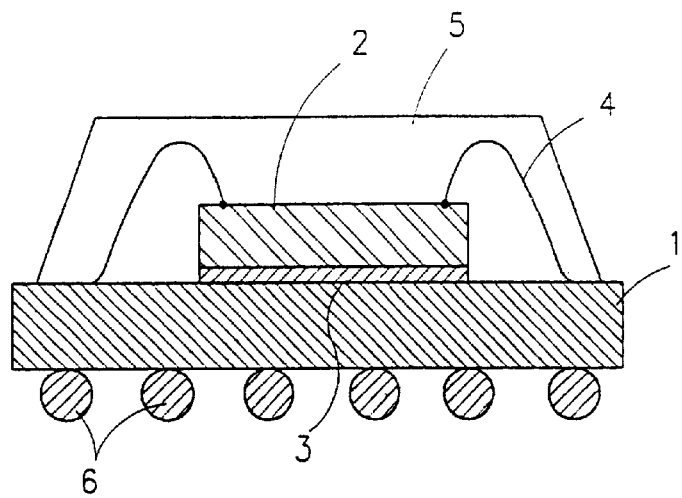
FIG. 1 is a schematic cross-sectional view of a BGA semiconductor package.
Figure 2:
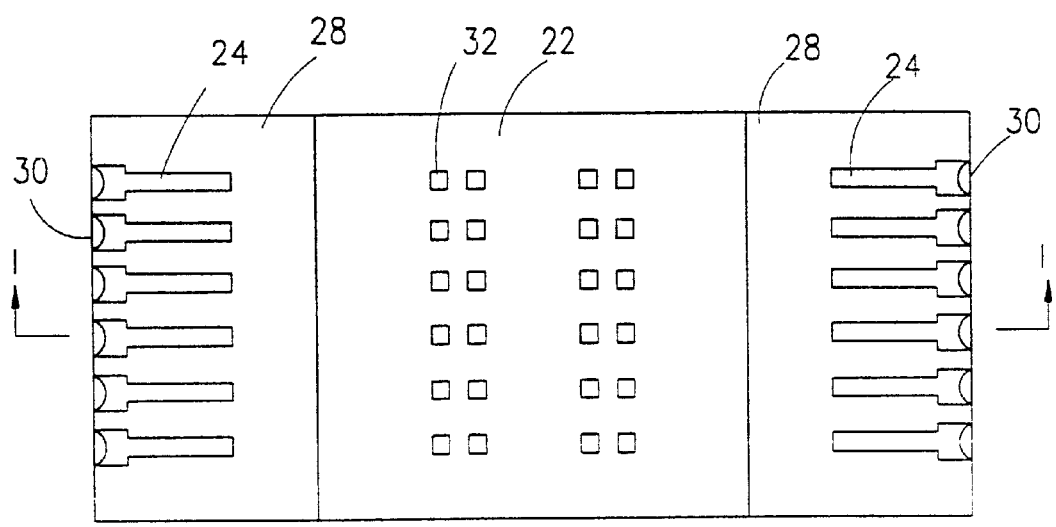
FIG. 2 is a plan view illustrating a substrate for a semiconductor chip package according to a preferred embodiment of the present invention.
Figure 3:
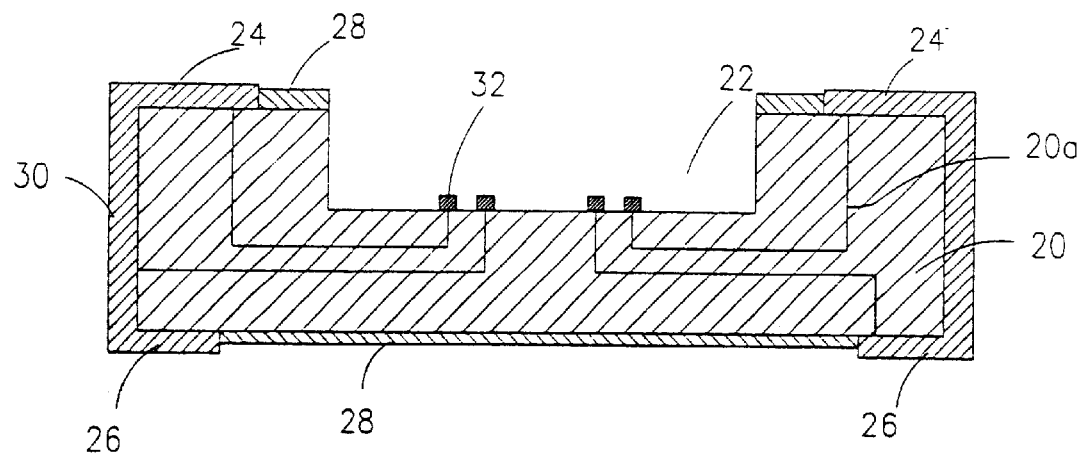
FIG. 3 is a cross-sectional view taken along line I—I in FIG. 2.

FIG. 2 is a plan view illustrating a substrate for a semiconductor chip package according to a preferred embodiment of the present invention, and FIG. 3 is a cross-sectional view taken along line I—I in FIG. 2. As shown therein, the substrate includes an insulation body 20 embedded therein with a plurality of conductive interconnections 20a. A recess/cavity 22 is formed in an upper central portion of the insulation body 20. A plurality of first conductive interconnection layers 24, preferably forming a pattern, are formed on each of the respective marginal or peripheral upper surfaces of the insulation body 20, and outside the cavity 22. A plurality of second conductive interconnection layers 26, forming a pattern are formed on each of the respective marginal or peripheral lower surfaces of the insulation body 20 so as to correspond to the first conductive interconnection layers 24.

A solder mask layer 28 is formed on the upper and lower surfaces of the insulation body 20 with the exception of the first and second conductive interconnection layers 24, 26 which are electrically connected by a plurality of third conductive interconnection layers 30, preferably forming a pattern, formed along the respective side walls of the insulation body 20. A plurality of conductive bond pads 32 is formed on the bottom of the cavity 22. An end of each of the plurality of conductive interconnections 20a is electrically connected to a corresponding one of the bond pads 32, and another end of each of the plurality of conductive interconnections 20a is electrically connected to one selected from the first conductive interconnection layers 24, the second conductive interconnection layers 26, and the third conductive interconnection layers 30.

Figure 4:
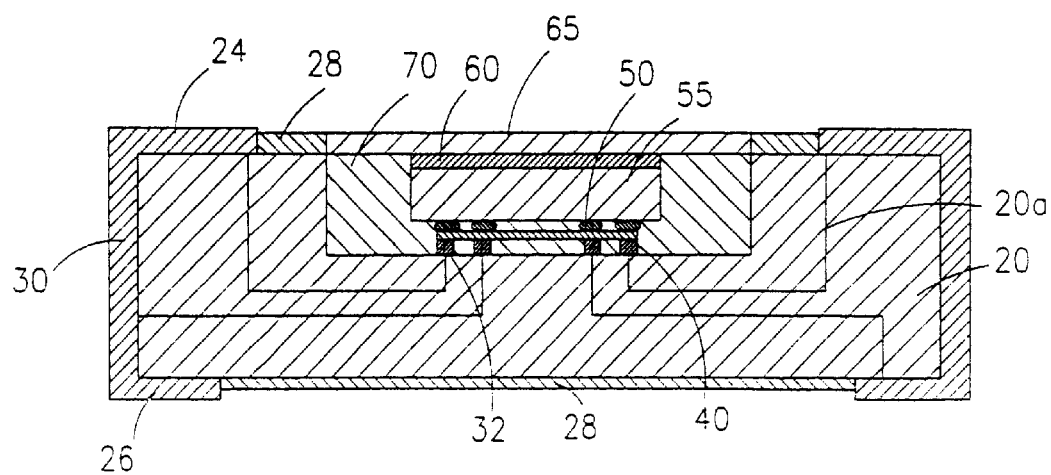
FIG. 4 is a cross-sectional view of an LGA semiconductor chip package employing a substrate illustrated in FIG. 3.

FIG. 4 is a cross-sectional view of a land grid layers array (LGA) type semiconductor chip package employing the preferred substrate. As shown therein, a first adhesive member 40 made of an anisotropic conductive material is attached on the respective bond pads 32 formed on the bottom of the cavity 22. A plurality of bumps 50 is formed on the upper surface of the first adhesive member 40, and a semiconductor chip 55 is formed on the respective bumps 50 which are provided to respond to the respective bond pads 32.

A heat discharge member 65 is attached, using a second adhesive member 60 as a medium, onto the upper surface of the semiconductor chip 55 while covering the cavity 22. The heat discharge member 65 is provided to cover an upper space of the cavity 22. An epoxy molding compound 70 is formed in the cavity 22 so as to encapsulate the bond pads 32, the first adhesive member 40, the bumps 50, the semiconductor chip 55, and the second adhesive member 60.

Figure 5:
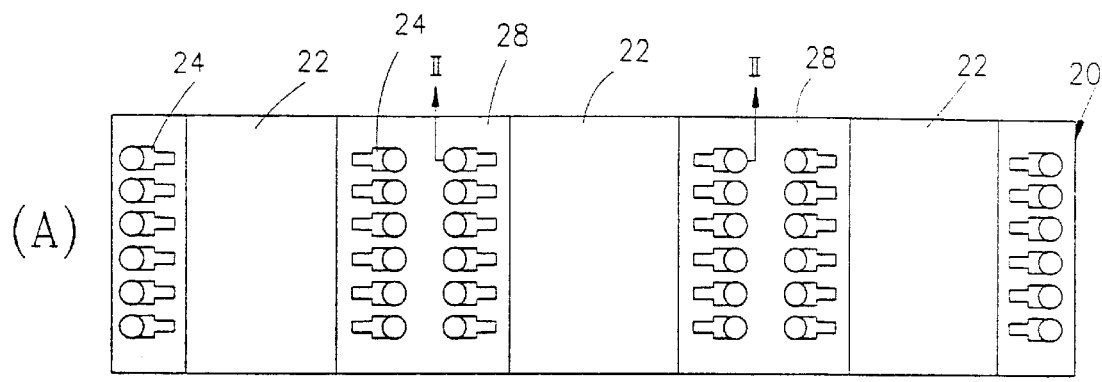
FIGS. 5A–5C are plan views illustrating sequential fabrication steps for making the semiconductor package substrate illustrated in FIG. 3.
Figure 5:
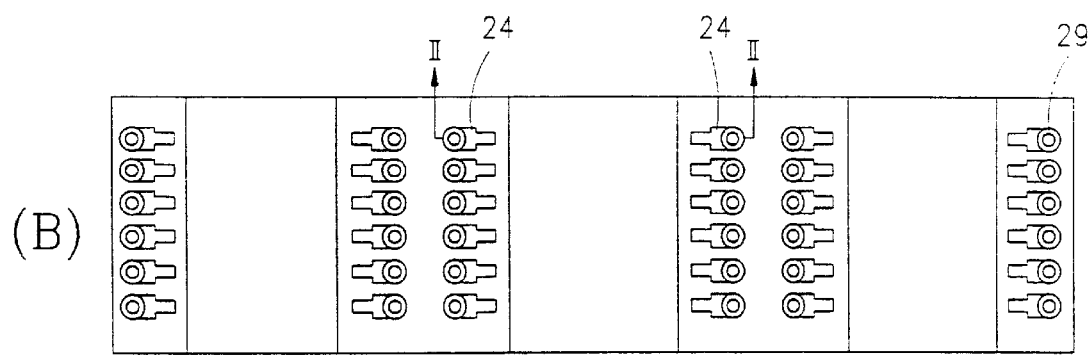
Figure 5:
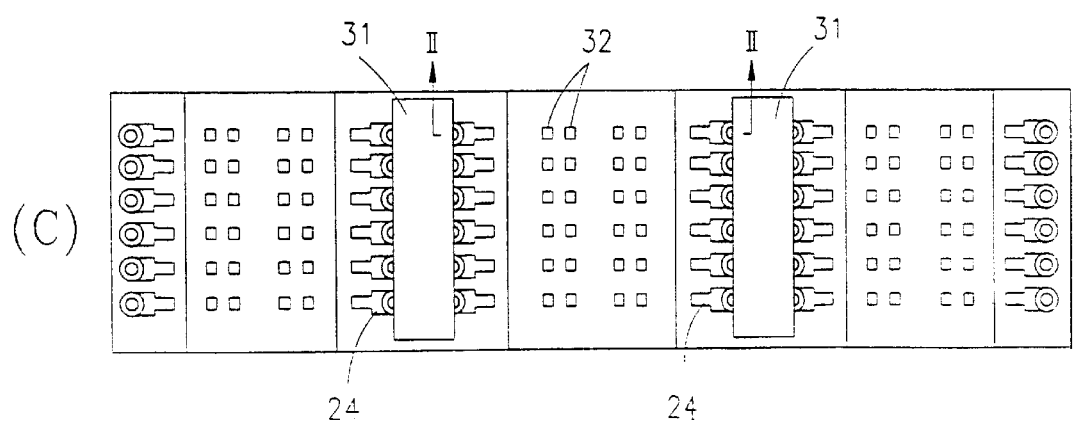

FIGS. 5A through 5C are sequential plan views illustrating a fabrication method for the semiconductor package substrate of FIG. 3, and FIGS. 6A through 6C are sequential cross-sectional views taken along lines II—II in FIGS. 5A–5C, respectively.

Figure 6:
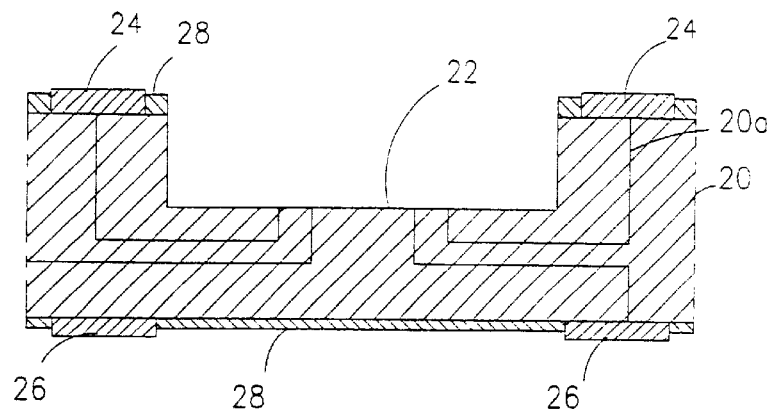
FIGS. 6A–6C are sequential cross-sectional views taken along lines II—II in FIGS. 5A–5C, respectively.
Figure 6:
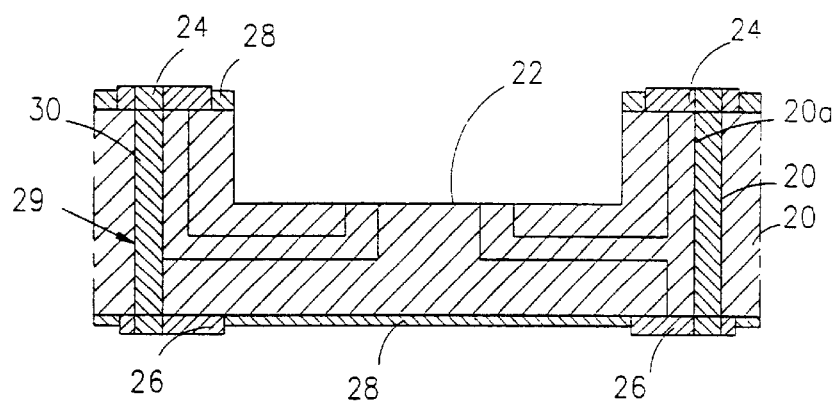
Figure 6:
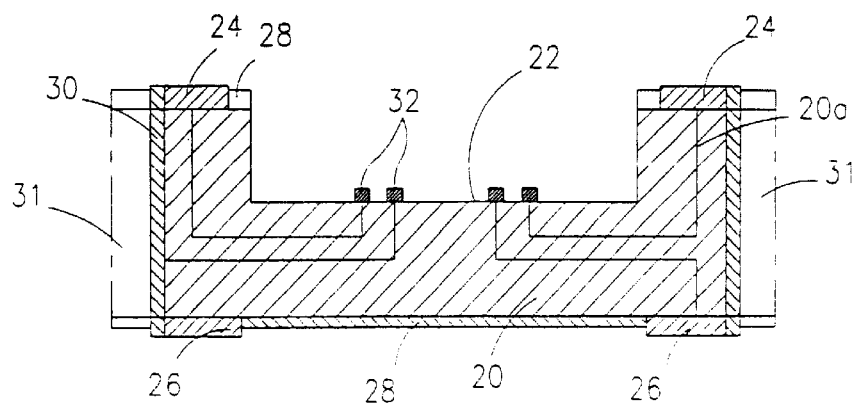

First, as shown in FIGS. 5A and 6A, there is provided an insulation body 20 embedded and patterned therein with a plurality of conductive interconnections 20a. A plurality of cavities 22 is selectively formed in the upper surface of the insulation body 20. A plurality of first conductive interconnection layers 24 is formed on each of the respective marginal upper surfaces of the insulation body 20 and outside the cavity 22, and a plurality of second conductive interconnection layers 26 is formed on each of the respective marginal lower surfaces of the insulation body 20 so as to correspond to the first conductive interconnection layers 24.

A solder mask layer 28 is formed on the upper and lower surfaces of the insulation body 20 with the exception of the first and second conductive interconnection layers 24, 26. An end of each of the plurality of conductive interconnections 20a is exposed at the bottom of the cavity 22, and another end of each of the plurality of conductive interconnections 20a is patterned and electrically connected to one selected from the first conductive interconnections 24, and the second conductive interconnections 26.

Next, as shown in FIGS. 5B and 6B, a plurality of through holes 29 is formed vertically through each of the first and second conductive interconnection patterns 24, 26. Then, each of the through holes 29 is coated or filled with a conductive material 30, thereby electrically communicating the first conductive interconnection layers 24 and the second conductive interconnection layers 26 through the conductive material 30 filled in corresponding ones of the through holes 29.

Then, as shown in FIGS. 5C and 6C, respective outside portions of the conductive materials 30 filled in the through holes 29 are removed in order to form a rectangular opening 31. A plurality of conductive bond pads 32 is formed on the bottoms of the respective cavities 22, thereby completing the substrate fabrication for the semiconductor package according to the preferred embodiment of the present invention.

Figure 7A:
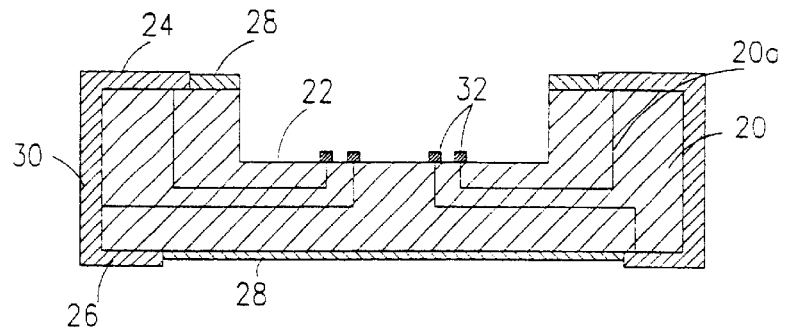
FIGS. 7A–7D are cross-sectional views illustrating sequential fabrication steps for making an LGA semiconductor package according to a preferred embodiment of the present invention.
Figure 7B:
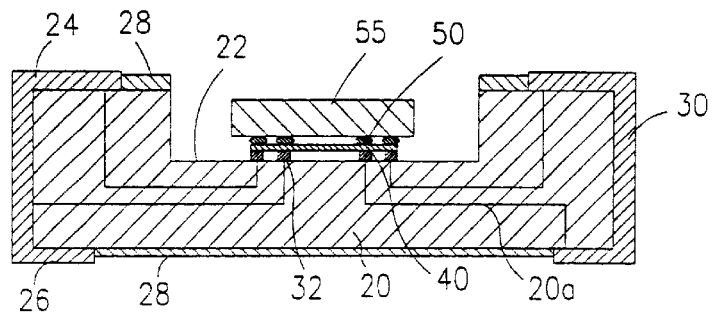

FIGS. 7A through 7D are sequential cross-sectional views illustrating a fabrication method for an LGA type semiconductor package according to a preferred embodiment of the present invention. First, the semiconductor substrate in FIGS. 5C and 6C is provided, as illustrated in FIG. 7A. As shown in FIG. 7B, a first adhesive member 40 made of an anisotropic conductive material is attached on the respective bond pads 32 formed on the bottom of the cavity 22. A plurality of bumps 50 are formed on the upper surface of the first adhesive member 40, and a semiconductor chip 55 is formed on the respective bumps 50 which are provided to respond to the respective bond pads 32.

Figure 7C:
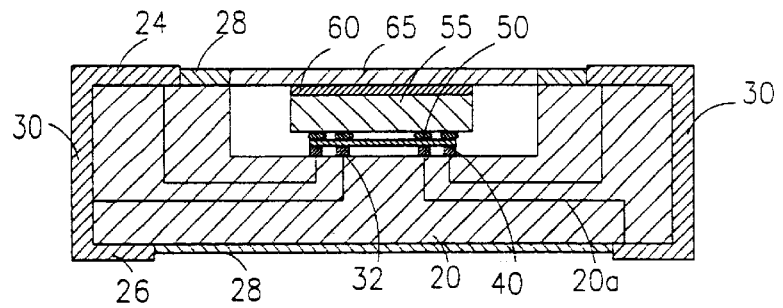
Figure 7D:
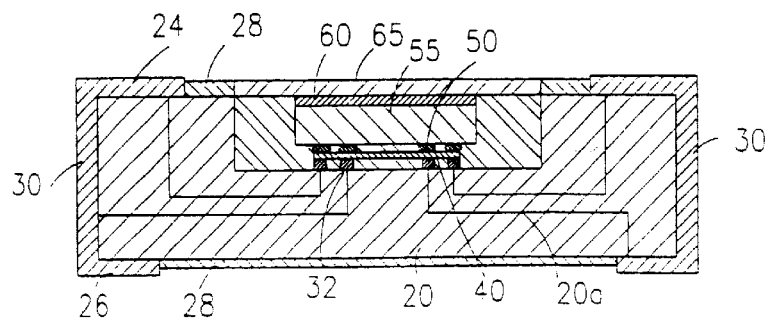

As further shown in FIG. 7C, a heat discharge member 65 is attached using a second adhesive member 60 as a medium onto the upper surface of the semiconductor chip 55. The heat discharge member 65 is provided to cover an upper space of the cavity 22. Finally, as shown in FIG. 7D, an epoxy molding compound 70 is formed in the cavity 22 so as to encapsulate the bond pads 32, the first adhesive member 40, the bumps 50, the semiconductor chip 55 provided on the bumps 50, and the second adhesive member 60.

As described above, the preferred substrate for a semiconductor chip package is applicable to a laminatable or a multi-layered LGA semiconductor chip package. Also, the LGA semiconductor chip package according to the preferred embodiment is provided with a plurality of external terminals, such as the first conductive interconnection patterns 24 and the second conductive interconnection patterns 26, which are formed on the upper and lower surfaces of the package and electrically connected between the first and second interconnection pattern. The heat discharge member is formed on the upper surface of the semiconductor chip so as to serve as a heat sink, thereby facilitating a heat discharge from the semiconductor chip.

Further, the plurality of external terminals such as the first conductive interconnection patterns 24 and the second conductive interconnection patterns 26 serving to externally transmit an electrical signal from the semiconductor chip are connected from the lower surface to the side surface, thereby strengthening a bonding (a solder joint reliability) between the lower surface of the package and a printed circuit board when the package is being mounted on the printed circuit board.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A method for making a substrate for a chip package, comprising:

forming an insulation body having a plurality of first conductive interconnections formed therein;

forming a cavity in upper portions of the insulation body;

forming a plurality of first conductive interconnection patterns outside the cavity and on marginal upper surfaces of the insulation body;

forming a plurality of second conductive interconnection patterns on marginal lower surfaces of the insulation body;

forming a plurality of third conductive interconnection patterns for coupling said first and second conductive interconnection patterns; and forming a plurality of conductive bond pads on a surface of the cavity, said conductive bond pads being coupled to at least one of said first, second and third conductive interconnection patterns by corresponding first conductive interconnections.

2. The method of claim 1, wherein forming said plurality of third conductive interconnection pattern comprises:

forming a plurality of holes vertically through the first and second conductive interconnection patterns and the insulation body provided between the first and second conductive interconnection patterns;

filling of the plurality of holes with a conductive material;

forming an opening in the insulation body by removing respective outside portions of the conductive material filled in each of the holes.

3. The method of claim 1, further comprising forming a solder mask layer on upper and lower surfaces of the insulation body between the first and second conductive interconnection patterns.

4. A method for making a chip package, comprising:

forming an insulation body having a plurality of first conductive interconnections formed therein;

forming a cavity in upper portions of the insulation body;

forming a plurality of first conductive interconnection patterns outside the cavity and on marginal upper surfaces of the insulation body;

forming a plurality of second conductive interconnection patterns on marginal lower surfaces of the insulation body;

forming a plurality of holes vertically through the first and second conductive interconnection patterns and the insulation body;

filling of the plurality of holes with a conductive material;

forming an opening in the insulation body by removing respective outside portions of the conductive material filled in each of the holes;

forming a plurality of conductive bond pads on a bottom of the cavity;

attaching a semiconductor chip on the bond pads by a first adhesive member;

forming a heat discharge member by a second adhesive member on an upper surface of the semiconductor chip; and filling the cavity with an epoxy molding compound.

5. The method of claim 4, wherein the first adhesive member is formed of an anisotropic conductive material.

6. The method of claim 4, wherein the second adhesive member is formed of a thermal conductive epoxy.

7. The method of claim 5, further comprising forming a plurality of bumps between the semiconductor chip and the anisotropic conductive member.

8. The method of claim 7, wherein the plurality of bumps are formed to correspond to the plurality of bond pads.

9. A method for making a chip package, comprising:

forming an insulation body having a plurality of first conductive interconnections formed therein;

forming a cavity in an upper portion of the insulation body;

forming a plurality of conductive patterns and coupling said conductive patterns to the first conductive interconnections;

forming a plurality of conductive bond pads on a surface of the cavity, and coupling said conductive bond pads to at least one of said conductive interconnections by corresponding interconnections;

coupling a chip to the conductive bond pads; and filling the cavity with a molding compound.

10. The method of claim 9, wherein forming said conductive patterns comprises:

forming a plurality of first conductive interconnection patterns outside the cavity and on marginal upper surfaces of the insulation body;

forming a plurality of second conductive interconnection patterns on marginal lower surfaces of the insulation body; and forming a plurality of third conductive interconnection patterns for coupling said first and second conductive interconnection patterns.

11. The method of claim 10, wherein forming a plurality of third conductive interconnection patterns for coupling said first and second conductive interconnection patterns comprises:

forming a plurality of holes vertically through the first and second conductive interconnection patterns and the insulation body provided between the first and second conductive interconnection patterns;

filling the plurality of holes with a conductive material; and forming an opening in the insulation body by removing respective outside portions of the conductive material filled in each of the holes.

12. The method of claim 10, further comprising forming a solder mask layer on upper and lower surfaces of the insulation body between the first and second conductive interconnection patterns.

13. The method of claim 10, wherein forming a plurality of third conductive interconnection patterns for coupling said first and second conductive interconnection patterns comprises forming the third conductive interconnection patterns in the insulation body.

14. The method of claim 10, wherein forming a plurality of third conductive interconnection patterns for coupling said first and second conductive interconnection patterns comprises forming the third conductive interconnection patterns on and along side walls of the insulation body.

15. The method of claim 9, further comprising attaching a heat discharge member using an adhesive member onto an upper surface of the chip to cover the cavity.

16. The method of claim 15, wherein the adhesive member is formed of a thermal conductive epoxy.

17. The method of claim 9, wherein coupling a chip to the conductive bond pads comprises coupling the chip to the conductive bond pads through an anisotropic conductive material.

18. The method of claim 17, further comprising forming a plurality of bumps between the chip and the anisotiropic conductive member.

19. The method of claim 18, wherein the plurality of bumps are formed to correspond to the plurality of conductive bond pads.

* * * * *